(12) United States Patent
Rofougaran et al.

(10) Patent No.: US 8,350,630 B2
(45) Date of Patent: Jan. 8, 2013

(54) METHOD AND SYSTEM FOR LOGEN BASED ON HARMONICS USING MICROSTRIP TECHNIQUES

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 87 days.

(21) Appl. No.: 11/864,732

(22) Filed: Sep. 28, 2007

(65) Prior Publication Data

US 2009/0085698 A1   Apr. 2, 2009

(51) Int. Cl.
*H01L 23/66* (2006.01)
(52) U.S. Cl. .................. 331/107 SL; 455/339
(58) Field of Classification Search ............ 331/107 SL; 455/339, 73
See application file for complete search history.

(56) References Cited

U.S. PATENT DOCUMENTS

| | | | | |
|---|---|---|---|---|
| 6,442,374 | B1 * | 8/2002 | Brady et al. | 455/73 |
| 6,492,883 | B2 | 12/2002 | Liang | |
| 6,867,659 | B2 * | 3/2005 | Kolsrud | 333/20 |
| 7,102,465 | B2 * | 9/2006 | Utsunomiya et al. | 333/174 |
| 7,174,147 | B2 * | 2/2007 | Toncich et al. | 455/339 |
| 2003/0042997 | A1 * | 3/2003 | Baik et al. | 333/156 |
| 2009/0088105 | A1 | 4/2009 | Rofougaran | |

OTHER PUBLICATIONS

Eva Murphy et al., "Ask the Application Engineer—33. All About Direct Digital Synthesis", Aug. 2004, Analog Dialogue, 38-08, p. 1.*
Shau-Gang Mao, "Coplanar Waveguide Bandpass Filters With Compact Size and Wide Spurious-Free Stopband Using Electromagnetic Bandgap Resonators," IEEE Microwave and Wireless Components Letters, vol. 17, No. 3, Mar. 2007.
George L. Matthaei, "Narrow-Band, Fixed-Tuned, and Tunable Bandpass Filters With Zig-Zag Hairpin-Comb Resonators," IEEE Transactions on Microwave Theory and Techniques, vol. 51, No. 4, Apr. 2003.

* cited by examiner

*Primary Examiner* — Joseph Chang
(74) *Attorney, Agent, or Firm* — Farjami & Farjami LLP

(57) ABSTRACT

Aspects of a method and system for LOGEN based on harmonics using microstrip techniques may include generating an output local oscillator signal from a non-sinusoidal input local oscillator signal by filtering the non-sinusoidal input local oscillator signal via a microstrip filter, wherein the output local oscillator signal may comprise a fundamental frequency that may be given by a harmonic frequency of the non-sinusoidal input local oscillator signal. The microstrip filter may be a programmable bandpass filter or a programmable stopband filter. The microstrip filter may be tuned to the harmonic frequency. The microstrip filter may be configured by adjusting a center frequency via a capacitance and/or an inductance. The bandwidth of the microstrip filter may be configured. The microstrip filter may be a programmable coplanar waveguide filter, and its center frequency may be configured via an inductance and/or a capacitance.

20 Claims, 6 Drawing Sheets

METHOD AND SYSTEM FOR LOGEN BASED ON HARMONICS USING MICROSTRIP TECHNIQUES

CROSS-REFERENCE TO RELATED APPLICATIONS/INCORPORATION BY REFERENCE

Not applicable.

FIELD OF THE INVENTION

Certain embodiments of the invention relate to wireless communication. More specifically, certain embodiments of the invention relate to a method and system for LOGEN based on harmonics using microstrip techniques.

BACKGROUND OF THE INVENTION

In 2001, the Federal Communications Commission (FCC) designated a large contiguous block of 7 GHz bandwidth for communications in the 57 GHz to 64 GHz spectrum. This frequency band may be used by the spectrum users on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this part of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. For example, 60 GHz signals may provide markedly different communications channel and propagation characteristics, not least due to the fact that 60 GHz radiation is partly absorbed by oxygen in the air, leading to higher attenuation with distance. On the other hand, since a very large bandwidth of 7 GHz is available, very high data rates may be achieved. Among the applications for 60 GHz communications are wireless personal area networks, wireless high-definition television signal, for example from a set top box to a display, or Point-to-Point links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A method and/or system for LOGEN based on harmonics using microstrip techniques, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for LOGEN based on harmonics using microstrip techniques. Aspects of a method and system for LOGEN based on harmonics using microstrip techniques may comprise generating an output local oscillator signal from a non-sinusoidal input local oscillator signal by filtering the non-sinusoidal input local oscillator signal via a microstrip filter, wherein the output local oscillator signal may comprise a fundamental frequency that may be given by a harmonic frequency of the non-sinusoidal input local oscillator signal. The microstrip filter may be a programmable bandpass filter or a programmable stopband filter. The microstrip filter may be tuned to the harmonic frequency. The microstrip filter may be configured by adjusting a center frequency via a capacitance and/or an inductance. The bandwidth of the microstrip filter may be configured. The microstrip filter may be a programmable coplanar waveguide filter, and its center frequency may be configured via an inductance and/or a capacitance. The bandwidth of the programmable coplanar waveguide filter may be configurable.

Figure 1:
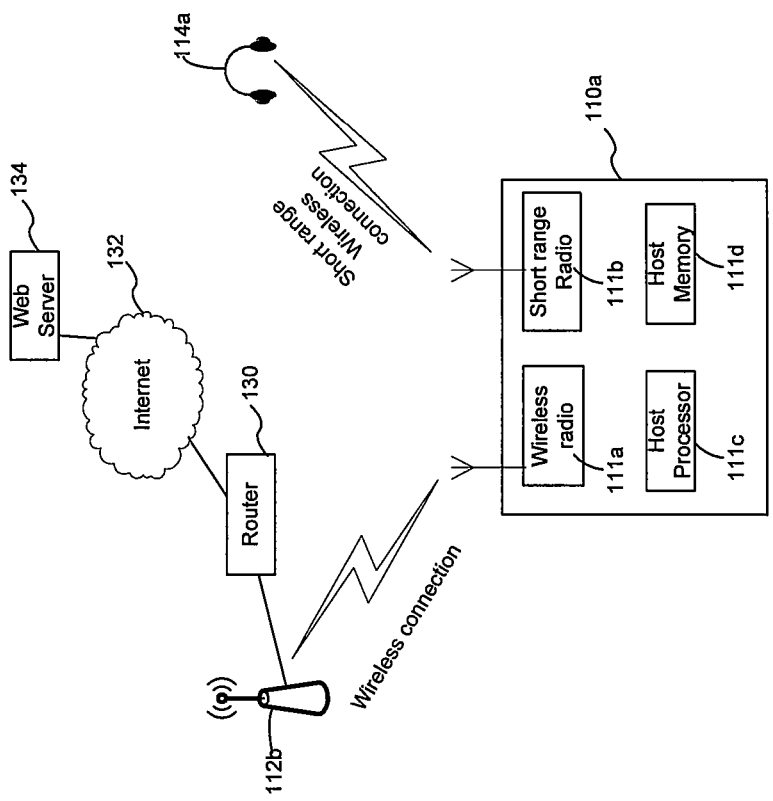
FIG. 1 is a diagram illustrating an exemplary wireless communication system, in connection with an embodiment of the invention.

FIG. 1 is a diagram illustrating an exemplary wireless communication system, in connection with an embodiment of the invention. Referring to FIG. 1, there is shown an access point 112b, a computer 110a, a headset 114a, a router 130, the Internet 132 and a web server 134. The computer or host device 110a may comprise a wireless radio 111a, a short-range radio 111b, a host processor 111c, and a host memory 111d. There is also shown a wireless connection between the wireless radio 111a and the access point 112b, and a short-range wireless connection between the short-range radio 111b and the headset 114a.

Frequently, computing and communication devices may comprise hardware and software to communicate using multiple wireless communication standards. The wireless radio 111a may be compliant with a mobile communications standard, for example. There may be instances when the wireless radio 111a and the short-range radio 111b may be active concurrently. For example, it may be desirable for a user of the computer or host device 110a to access the Internet 132 in order to consume streaming content from the Web server 134. Accordingly, the user may establish a wireless connection between the computer 110a and the access point 112b. Once this connection is established, the streaming content from the Web server 134 may be received via the router 130, the access point 112b, and the wireless connection, and consumed by the computer or host device 110a.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications.

Figure 2:
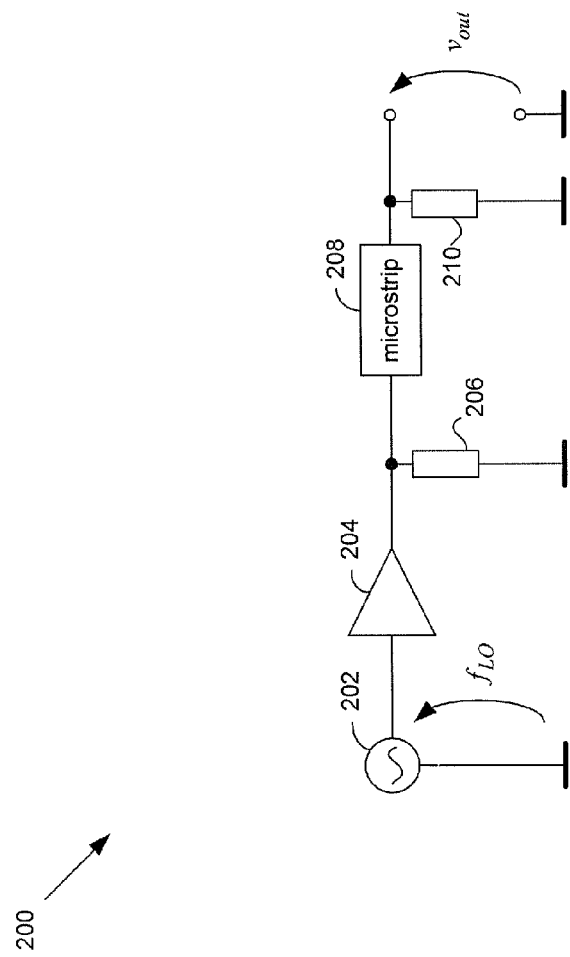
FIG. 2 is a diagram illustrating a LOGEN generator based on using harmonics, in accordance with an embodiment of the invention.

FIG. 2 is a diagram illustrating a LOGEN generator based on using harmonics, in accordance with an embodiment of the invention. Referring to FIG. 2, there is shown a local oscillator 202, an amplifier 204, loads 206 and 210, and a microstrip 208. There is also shown a local oscillator signal $f_{LO}$ and an output signal $v_{out}$.

The local oscillator 202 may comprise suitable logic, circuitry and/or code that may be enabled to generate a clock signal $f_{LO}$, for example of an approximately rectangular pulse-shape, at an angular fundamental frequency $w_{LO}=2\pi f_0 t$. The output of the local oscillator 202 may be communicatively coupled to the amplifier 204 that may comprise suitable logic, circuitry and/or code that may be enabled to generate an output signal that may be an amplified version of the input signal. The load 206 may be used, for example, to bias the output of the amplifier 204. The microstrip 208 may comprise suitable logic, circuitry and/or code that may be enabled to provide a variable impedance as a function of the frequency of its input signal. The load 210 may be enabled to be an output load, for example.

In some instances, it may be difficult to generate a local oscillator signal $f_{LO}$ that may be sufficiently high in its fundamental frequency to be used for a desirable application, for example demodulation of a 60 GHz communications signal. In these instances, in accordance with various embodiments of the invention, suitable harmonics comprised in the local oscillator signal $f_{LO}$ may be used to generate a suitable oscillator output signal $v_{out}$. In one exemplary embodiment of the invention, the signal $f_{LO}$ may be given by a rectangular pulse train. The spectrum of the signal $f_{LO}$ may be approximated by the following relationship:

$$F(f_{LO}) \propto \cos(w_{LO}t) + \frac{1}{3}\cos(3w_{LO}t) + ò$$

where F(.) may denote the Fourier series, and ò may denote other terms not expressly denoted. The equation may illustrate that the rectangular pulse train may comprise a fundamental frequency component $\cos(w_{LO}t)$ and, among other generally weaker frequency components, a third harmonic given by $\cos(3w_{LO}t)$. In this instance, the third harmonic amplitude may be less than the amplitude of the fundamental frequency component. This may be true for many signals $f_{LO}$.

In accordance with various embodiments of the invention, an oscillator signal $v_{out}$ may be generated from $f_{LO}$ by retaining only a harmonic signal and rejecting other frequency components. This may be achieved by the microstrip 208, which may act as a frequency dependent impedance. The microstrip 208 may be programmable and may be tuned to a range of frequencies. For example, the impedance of the microstrip 208 may be high, except for a narrow range of frequencies around its tuned frequency. This range of frequencies around the center frequency may be the bandwidth of the microstrip 208 and may be programmable. The microstrip 208 may be tuned, for example, to the third harmonic frequency of the signal $f_{LO}$. In this instance, the microstrip 208 may be low impedance only in a narrow range around $\cos(3w_{LO}t)$. Hence, for the frequency component $\cos(3w_{LO}t)$ in $f_{LO}$, the microstrip 208 may appear like a short circuit.

The signal component of the third harmonic may therefore appear in the voltage $$v_{out} = K \cdot \frac{1}{3}\cos(3w_{LO}t)$$

across the load 210, where K may be an amplification factor due to the amplifier 204. For the other frequency components in $f_{LO}$, the microstrip may appear like a open circuit with very high impedance. The load 210 may be much of much lower impedance than the microstrip 208 for non-tuned frequencies. Hence, the voltage applied to the microstrip 208 may dissipate across the microstrip 208 and the voltage across the load 210 may be small. In these instances, hence, the output voltage may comprise the third harmonic and only significantly attenuated components at the other frequencies, so that $$v_{out} \approx K \cdot \frac{1}{3}\cos(3w_{LO}t).$$

In this instance, the output voltage may generate an approximately sinusoidal output voltage with a frequency 3 times higher than the fundamental frequency of $f_{LO}$.

In another embodiment of the invention, the generated local oscillator signal $f_{LO}$ may be chosen of a different shape than a rectangular pulse train. In these instances, other frequency harmonics than the third harmonic may be more desirable and the microstrip may be tuned to a desirable N-th harmonic, in function of the pulse shape of $f_{LO}$.

Figure 3A:
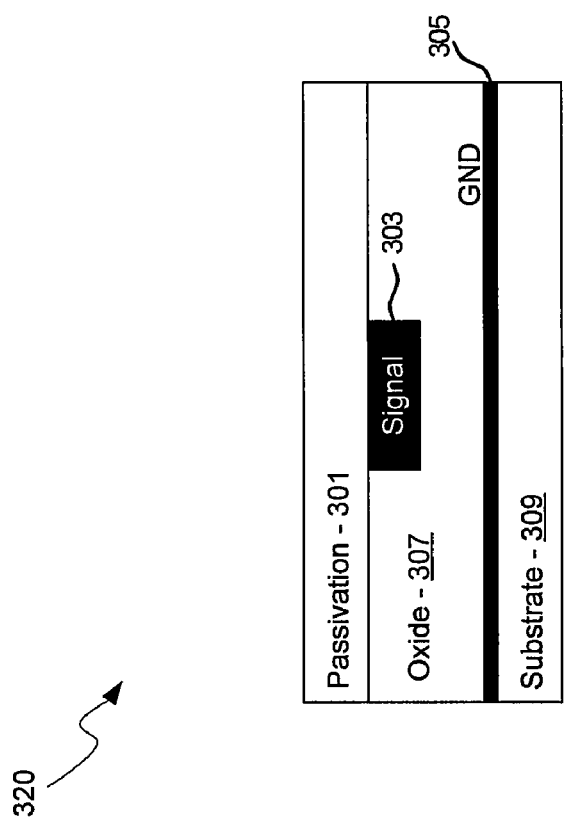
FIG. 3A is a block diagram illustrating a cross-sectional view of a microstrip bandpass filter, in accordance with an embodiment of the invention.

FIG. 3A is a block diagram illustrating a cross-sectional view of a microstrip bandpass filter, in accordance with an embodiment of the invention. Referring to FIG. 3A, there is shown a microstrip bandpass filter (MS-BPF) 320. The MS-BPF 320 may comprise a passivation layer 301, a signal conductive line 303, a ground plane 305, an oxide layer 307 and a substrate 309.

The passivation layer 301 may comprise an oxide, nitride or other insulating layer that may provide electrical isolation between the signal conductive line 303, the ground plane 305 and other circuitry on the substrate 309. The passivation layer 301 may provide protection from environmental factors for the underlying layers of the MS-BPF 320. In addition, the passivation layer 301 may be selected based on its dielectric constant and its effect on the electric field that may be present between conductive lines.

The signal conductive line 303 may comprise metal traces embedded in the oxide layer 307. In another embodiment of the invention, the signal conductive line 303 may comprise poly-silicon or other conductive material. The separation and the voltage potential between the signal conductive line 303 and the ground plane 305 may determine the electric field generated therein. In addition, the dielectric constant of the oxide 307 may also determine the electric field between the signal conductive line 303 and the ground plane 305.

The oxide layer 307 may comprise SiO$_2$ or other oxide material that may provide a high resistance insulating layer between the signal conductive line 303 and the ground plane 305. In addition, the oxide layer 307 may provide a means for configuring the electric field between the signal conductive line 303 and the ground plane 305 by the selection of an oxide material with an appropriate dielectric constant.

The substrate 309 may comprise a semiconductor or insulator material that may provide mechanical support for the MS-BPF 320 and other devices that may be integrated. The substrate 309 may comprise Si, GaAs, sapphire, InP, GaO, ZnO, CdTe, CdZnTe and/or Al$_2$O$_3$, for example, or any other substrate material that may be suitable for integrating microstrip structures.

In operation, an AC signal may be applied across the signal conductive line 303 and the ground plane 305. The spacing between the conductive line 303 and the ground plane 305, as well as the pattern of the conductive lines, may generate an inductance and a capacitance that may be utilized for filtering purposes, specifically bandpass filtering, in the present invention. In addition, programmable impedances may be coupled across the microstrip devices in the MS-BFP 320 to tune the center frequency and bandwidth and will be described further with respect to FIG. 3B.

Figure 3B:
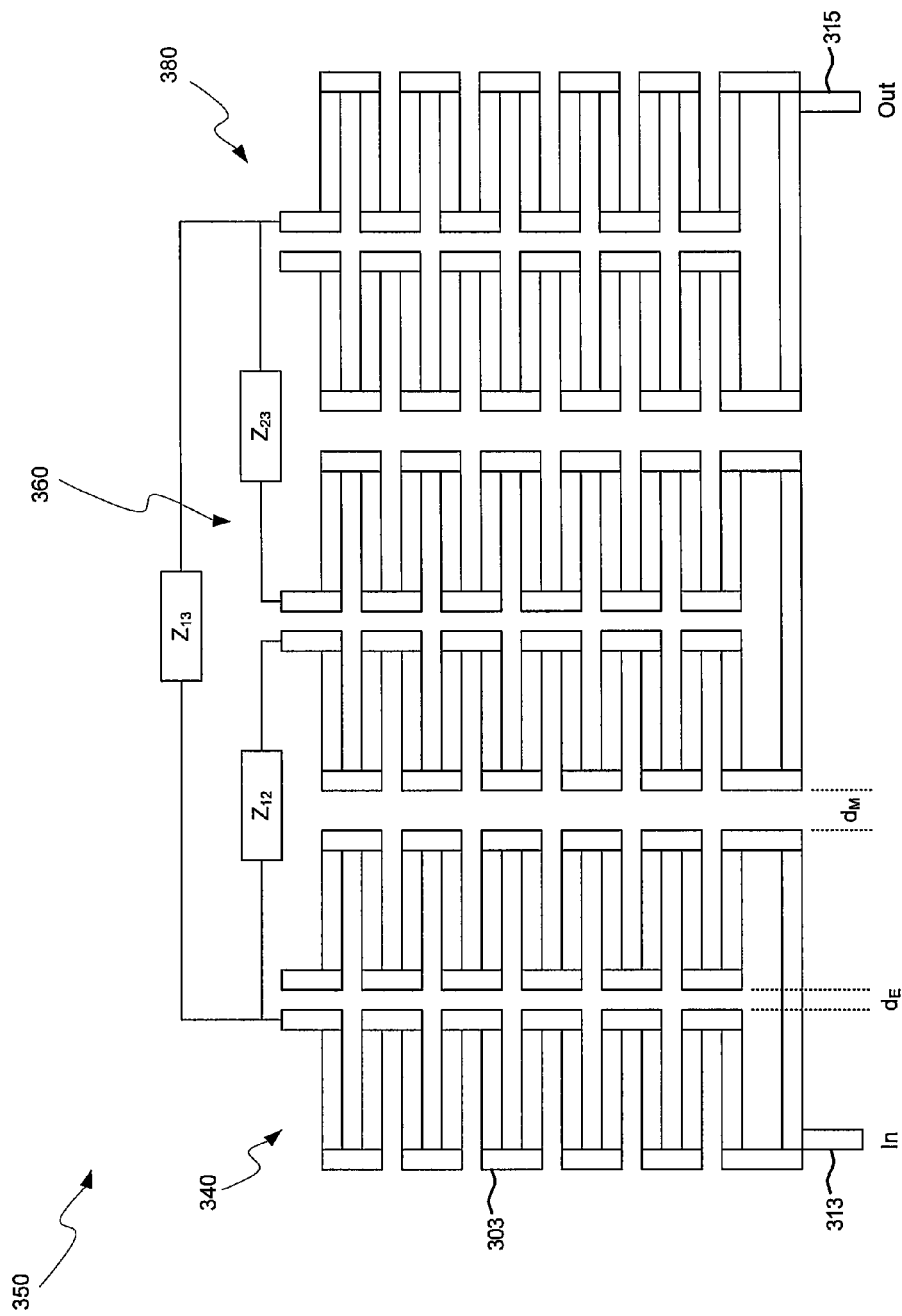
FIG. 3B is a block diagram of an exemplary microstrip bandpass filter, in accordance with an embodiment of the invention.
Figure 3C:
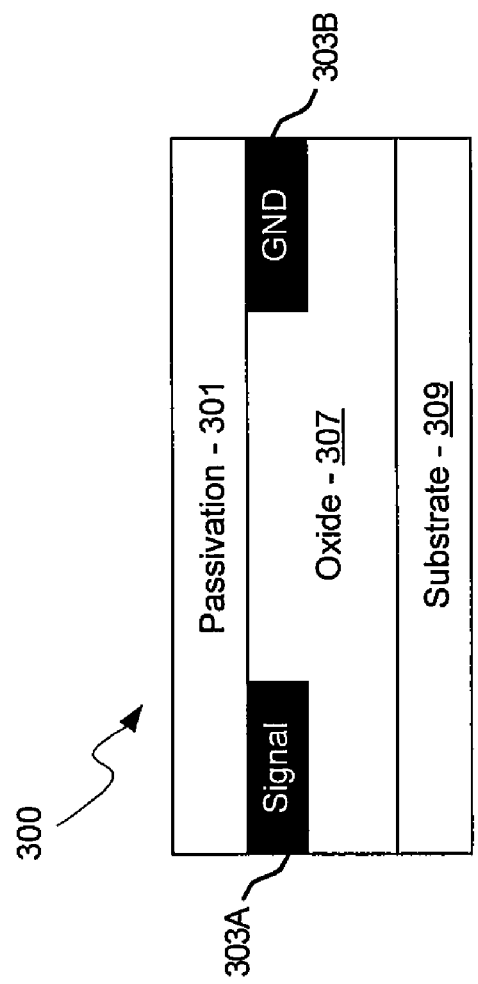
FIG. 3C is a block diagram illustrating a cross-sectional view of a coplanar waveguide bandpass filter, in accordance with an embodiment of the invention.

FIG. 3B is a block diagram of an exemplary microstrip bandpass filter, in accordance with an embodiment of the invention. Referring to FIG. 3C, there is shown a microstrip bandpass filter 350 comprising three resonator sections 340, 360 and 380, an input coupler 313 and an output coupler 315. Each resonator section 340, 360 and 380 may comprise a pattern of signal conductive line 303. In addition, there is shown programmable impedances $Z_{12}$, $Z_{23}$ and $Z_{13}$. The pattern of signal conductive line 303 is an exemplary embodiment. The invention is not limited to this type of structure, as any number of patterns may be utilized to create a bandpass filter. Changing the shape may change the frequency response of the MS-BPF 350. In this manner, the frequency response may be tuned to a particular range with the design of the signal conductive line 303, and fine tuning may be accomplished by adjusting the programmable impedances $Z_{12}$, $Z_{23}$ and $Z_{13}$.

The signal conductive line 303 may be as described with respect to FIG. 3A. The programmable impedances may comprise inductors and/or capacitors that may be programmably adjusted to modify the center frequency and bandwidth of the MS-BPF 350. The number and location of the impedances $Z_{12}$, $Z_{23}$ and $Z_{13}$ is not limited to the configuration shown in FIG. 3B. Accordingly, any number of impedances may be used at multiple locations within the MS-BPF 350.

The input and output couplers 313 and 315 may comprise inductive tap couplings for communicating signals into and out of the MS-BPF 350, respectively. In another embodiment of the invention, the input and output couplers 313 and 315 may comprise series-capacitance couplers.

In operation, an input signal may be communicated to the MS-BPF 350 via the input coupler 313. The desired frequency of operation may be configured by adjusting the impedances of the programmable impedances $Z_{12}$, $Z_{23}$ and $Z_{13}$. The filtered output signal may be communicated from the output coupler 315. In another embodiment of the invention, tuning may be accomplished by suspending portions of the MS-BPF 350 over the substrate with an air gap. By adjusting this air gap, via piezoelectric or electrostatic means, for example, the capacitance of the structure may be altered, adjusting the bandpass filter frequency.

FIG. 3C is a block diagram illustrating a cross-sectional view of a coplanar waveguide bandpass filter, in accordance with an embodiment of the invention. Referring to FIG. 3C, there is shown a coplanar waveguide bandpass filter (CPW-BPF) 300. The CPW-BPF 300 may comprise a passivation layer 301, a signal conductive line 303A, a ground conductive line 303B, an oxide layer 307 and a substrate 309.

The passivation layer 301 may comprise an oxide, nitride or other insulating layer that may provide electrical isolation between the conductive lines 303A and 303B and other circuitry on the substrate 309. The passivation layer 301 may provide protection from environmental factors for the underlying layers of the CPW-BPF 300. In addition, the passivation layer 301 may be selected based on its dielectric constant and its effect on the electric field that may be present between conductive lines.

The signal and ground conductive lines 303A and 303B may comprise metal traces embedded in the oxide layer 307. In another embodiment of the invention, the conductive lines may comprise polysilicon or other conductive material. The separation and the voltage potential between the signal conductive line 303A and the ground conductive line 303B, as well as the dielectric constant of the oxide 307 may determine the electric field generated therein.

The oxide layer 307 may comprise SiO$_2$ or other oxide material that may provide a high resistance insulating layer between the signal conductive line 303A and the ground conductive line 303B. In addition, the oxide layer 307 may provide a high resistance insulating layer between the substrate 309 and the conductive lines 303A and 303B.

The substrate 309 may comprise a semiconductor or insulator material that may provide mechanical support for the CPW-BPF 300 and other devices that may be integrated. The substrate 309 may comprise Si, GaAs, sapphire, InP, GaO, ZnO, CdTe, CdZnTe and/or Al$_2$O$_3$, for example, or any other substrate material that may be suitable for integrating coplanar waveguide structures.

In operation, an AC signal may be applied across the signal conductive line 303A and the ground conductive line 303B. The spacing between the conductive lines as well as the pattern of the conductive lines may generate an inductance and a capacitance that may be utilized for filtering purposes, specifically bandpass filtering, in the present invention. In addition, programmable impedances may be coupled across coplanar waveguide devices in the CPW-BFP 300 to tune the center frequency and bandwidth, and will be described further with respect to FIG. 3D.

Figure 3D:
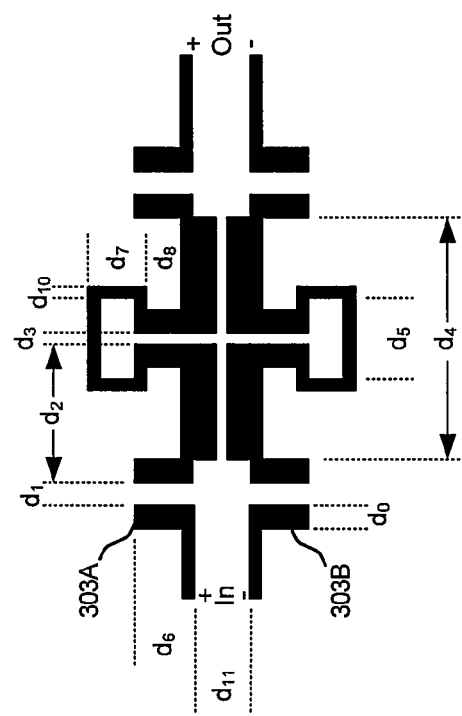
FIG. 3D is a block diagram of an exemplary coplanar waveguide bandpass filter, in accordance with an embodiment of the invention.

FIG. 3D is a block diagram of an exemplary coplanar waveguide bandpass filter, in accordance with an embodiment of the invention. Referring to FIG. 3D, there is shown a coplanar waveguide bandpass filter 325 comprising the signal conductive line 303A and the ground conductive line 303B embedded within an oxide layer and covered with a passivation layer as described with respect to FIG. 3C. The signal conductive line 303A may be as described with respect to FIG. 3C. The pattern of the signal conductive line 303A and the ground conductive line 303B is an exemplary embodiment. The invention is not limited to this type of structure, as any number of patterns may be utilized to create a bandpass filter. The CPW-BPF 325 may be designed for a particular frequency range by determining appropriate values for the dimensions $d_0$-$d_{11}$.

In operation, an input signal may be communicated to the CPW-BPF 325 at the plus and minus inputs labeled as "In" in FIG. 3D. The desired frequency of operation may be configured by the design of the conductive lines 303A and 303B. Changing the shape may change the frequency response of the CPW-BPF 325. In this manner, the frequency response may be tuned to a particular range with the design of the signal conductive line 303A and the ground conductive line 303B. Tuning may be accomplished by adjusting the dimensions of the structure, via switching sections in and out of the structure, for example. In another embodiment of the invention, tuning may be accomplished by suspending portions of the CPW-BPF 325 over the substrate with an air gap. By adjusting this air gap, via piezoelectric or electrostatic means, for example, the capacitance of the structure may be altered, adjusting the bandpass filter frequency. The filtered output signal may be communicated out of the CPW-BPF 325 at the plus and minus outputs labeled as "Out" in FIG. 3D.

In accordance with an embodiment of the invention, a method and system for LOGEN based on harmonics using microstrip techniques may comprise generating an output local oscillator signal, for example $v_{out}$ from a non-sinusoidal input local oscillator signal, for example $f_{LO}$ by filtering the non-sinusoidal input local oscillator signal via a microstrip filter, for example microstrip 208, wherein the output local oscillator signal $v_{out}$ may comprise a fundamental frequency that may be given by a harmonic frequency of the non-sinusoidal input local oscillator signal, as described for FIG. 2A. The microstrip filter may be a programmable bandpass filter or a programmable stopband filter. The microstrip filter may be tuned to the harmonic frequency, as described for FIG. 2A and FIG. 3A/B/C/D. The microstrip filter may be configured by adjusting a center frequency via a capacitance and/or an inductance. The bandwidth of the microstrip filter may be configured. The microstrip filter may be a programmable coplanar waveguide filter, and its center frequency may be configured via an inductance and/or a capacitance, as described in FIG. 3B. The bandwidth of the programmable coplanar waveguide filter may be configurable.

Another embodiment of the invention may provide a machine-readable storage, having stored thereon, a computer program having at least one code section executable by a machine, thereby causing the machine to perform the steps as described above for a method and system for LOGEN based on harmonics using microstrip techniques.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
    generating an output local oscillator signal from a non-sinusoidal input local oscillator signal at a first frequency by communicating said input local oscillator signal at said first frequency to a microstrip filter;
    tuning a bandpass frequency range of said microstrip filter by adjusting an air gap between said microstrip filter and a substrate underlying said microstrip filter;
    providing said output local oscillator signal to an output terminal such that an output voltage at said output terminal is sinusoidal and comprises only one integer harmonic frequency of said first frequency; wherein:
        said first frequency is outside of said bandpass frequency range of said microstrip filter;
        said integer harmonic frequency is within said bandpass frequency range of said microstrip filter; and
        said microstrip filter comprises a plurality of resonator sections, wherein each one of said plurality of resonator sections is coupled to each other one of said plurality of resonator sections via one of a plurality of programmable impedances.

2. The method according to claim 1, wherein said microstrip filter is a programmable bandpass filter or a programmable stopband filter.

3. The method according to claim 1, wherein said microstrip filter is tuned to said harmonic frequency by adjusting one or more of said plurality of programmable impedances.

4. The method according to claim 3, comprising configuring a center frequency of said microstrip filter by adjusting one or more of said plurality of programmable impedances.

5. The method according to claim 4, comprising adjusting a capacitance of said microstrip filter for said configuring of said center frequency.

6. The method according to claim 4, comprising adjusting an inductance of said microstrip filter for said configuring of said center frequency.

7. The method according to claim 2, comprising configuring a bandwidth of said microstrip filter by adjusting said one or more programmable impedances.

8. The method according to claim 1, wherein said microstrip filter comprises a programmable coplanar waveguide filter.

9. The method according to claim 8, comprising configuring a center frequency of said programmable coplanar waveguide filter.

10. A system for processing communication signals, the system comprising:
    one or more circuits, said one or more circuits being configured to:
        generate an output-local oscillator signal from a non-sinusoidal input local oscillator signal at a first frequency by communicating said input local oscillator signal at said first frequency to a microstrip filter;
        tune a bandpass frequency range of said microstrip filter by adjusting an air gap between said microstrip filter and a substrate underlying said microstrip filter;
        provide said output local oscillator signal to an output terminal such that an output voltage at said output terminal is sinusoidal and comprises only one sinusoidal integer harmonic frequency of said first frequency; wherein:

said first frequency is outside of a bandpass frequency range of said microstrip filter;

said integer harmonic frequency is within said bandpass frequency range of said microstrip filter; and said microstrip filter comprises a plurality of resonator sections, wherein each one of said plurality of resonator sections is coupled to each other one of said plurality of resonator sections via a programmable impedance.

11. The system according to claim 10, wherein said microstrip filter is a programmable bandpass filter or a programmable stopband filter.

12. The system according to claim 10, wherein said microstrip filter is tuned to said harmonic frequency by adjusting one or more of said plurality of programmable impedances.

13. The system according to claim 12, wherein said one or more circuits configure a center frequency of said microstrip filter by adjusting one or more of said plurality of programmable impedances.

14. The system according to claim 13, wherein said one or more circuits adjust a capacitance of said microstrip filter for said configuring of said center frequency.

15. The system according to claim 13, wherein said one or more circuits adjust an inductance of said microstrip filter for said configuring of said center frequency.

16. The system according to claim 11, wherein said one or more circuits configure a bandwidth of said microstrip filter by adjusting one or more programmable impedances.

17. The system according to claim 10, wherein said microstrip filter comprises a programmable coplanar waveguide filter.

18. The system according to claim 17, wherein said one or more circuits configure a center frequency of said programmable coplanar waveguide filter.

19. A communication system comprising:

a microstrip filter comprising a plurality of resonator sections coupled to each other via at least one microstrip having inductance that varies as a function of the frequency of an input signal; and one or more circuits configured to:

generate an output-local oscillator signal from a non-sinusoidal input local oscillator signal at a first frequency by communicating the input local oscillator signal at said first frequency to the microstrip filter;

tune a bandpass frequency range of said microstrip filter by adjusting an air gap between said microstrip filter and a substrate underlying said microstrip filter;

provide said output local oscillator signal to an output terminal such that an output voltage at said output terminal is sinusoidal and comprises only one sinusoidal integer harmonic frequency of said first frequency; wherein:

said first frequency is outside of said bandpass frequency range of said microstrip filter and said integer harmonic frequency is within said bandpass frequency range of said microstrip filter.

20. The communication system according to claim 19, wherein the microstrip filter comprises programmable impedance.

* * * * *